United States Patent Office
3,295,196
Patented Jan. 3, 1967

3,295,196

METHOD FOR ATTACHING INDIUM ARSENIDE SEMICONDUCTOR TO ELECTRICAL LEADS

Guenther Zaeschmar, Idyllwild, Calif., assignor to the United States of America as represented by the Secretary of the Navy No Drawing. Filed Jan. 30, 1964, Ser. No. 341,461
3 Claims. (Cl. 29—495)

The invention herein described may be manufactured and used by or for the Government of the United States of America for governmental purposes without the payment of any royalties thereon or therefor.

The present invention relates to electrical contacts for semiconductors and more particularly to a new method of soldering an indium arsenide semiconductor to an electrical lead.

Previous attempts to make good electrical contacts with semiconductors involved the use of an epoxy or conductive paint to mechanically hold the electrical contact in place; however, while affording a conducting connection these methods failed to provide a strong mechanical and low noise contact bond. In the previous methods the contact joint acted as a rectifier causing noise.

The novel method of the present invention for providing a low noise and mechanically strong junction comprises using indium as the bonding material and using arsenic trioxide as a flux. In the present invention the contact joint does not act as a rectifier.

It is an object of the present invention, therefore, to provide a novel means for bonding an indium arsenide semiconductor to an electrical lead.

It is another object of the invention to provide means for providing a mechanically strong and low noise contact bond between indium arsenide thin semiconductor and electrical leads.

A further object of the invention is to provide a method for bonding electrical leads to extremely delicate thin semiconductors.

Other objects and many of the attendant advantages of this invention will become readily appreciated as the same becomes better understood by reference to the following detailed description:

In preparing delicate thin semiconductors for use in electrical and magnetic experimental investigations, and other uses, it is necessary to make good electrical contact and strong mechanical bond between the semiconductor and the electrical leads. These thin semiconductors range from two to three-tenths of a millimeter in thickness (0.010 to 0.012 inch) and about one tenth of an inch in width by three tenths of an inch in length. It is apparent that such semiconductors are quite fragile and attaching electrical leads to them precisely in the proper location (e.g., the edges) requires extreme dexterity in handling, and at the same time a good electrical contact and strong bond must be provided.

According to the present invention, an indium arsenide thin semiconductor is placed upon a hot plate for best results to avoid heat loss during the soldering operation (heat should remain below 200° C. to avoid forming of single crystals of the semiconductor), and the electrical lead wire placed in contact with the semiconductor. Some grains of arsenic trioxide to be used as a flux are placed in proximity to the spot where the lead wire is to be soldered and a chip of indium is placed directly over the grains of arsenic trioxide; the indium provides the bond. Using a small, pointed 6–8 volt D.C. soldering iron, for example, for melting the indium, heat is applied to the indium chip and the grains of arsenic trioxide. The molten indium will contact with the arsenic trioxide which in turn will sublime and give off fumes. The indium will then flow onto the indium arsenide semiconductor, and electrical lead to complete a strong mechanical bond and good electrical contact. This bond joint when electrically tested has a low noise characteristic and does not act as a rectifier. The differences between the joint of present invention and previous methods are as obvious as the difference between a welded metal joint and a similar joint merely held together with soft solder. The joint of the present invention produces only low noise contact resistance. The electrical and mechanical bond of the present joint also has a decided advantage since the molten indium amalgamates with the indium arsenide, whereas silver epoxy or point used previously act only as an adhesive with small degrees of mechanical strength.

Lead telluride, lead sulfide and lead selenium semiconductors, for instance, can also be soldered in a similar manner using lead oxide as the flux and pure lead as the solder.

Obviously, many modifications and variations of the present invention are possible in the light of the above teachings. It is therefore to be understood that within the scope of the appended claims the invention may be practiced otherwise than as specifically described.

What is claimed is:

1. The method for attaching indium arsenide semiconductor to electrical leads comprising:
   (a) placing a thin indium arsenide semiconductor on a hot plate for heating the semiconductor to a temperature below its recrystallization point,
   (b) placing an electrical lead in contact with the semiconductor,
   (c) placing a few grains of arsenic trioxide in proximity with the spot where said electrical lead is to be bonded to said semiconductor,
   (d) placing a small chip of indium over said arsenic trioxide.
   (e) applying heat directly to said indium and arsenic trioxide until said arsenic trioxide sublimes and said indium flows onto and amalgamates with said indium arsenide completing a strong mechanical and electrical bond upon cooling between said electrical lead and said semiconductor.

2. The method for attaching indium arsenide semiconductor to electrical leads comprising:
   (a) placing an electrical lead in contact with an indium arsenide semiconductor at a spot where bonding is to be made,
   (b) placing a few grains of arsenic trioxide in proximity with the spot where said electrical leads is to be bonded to said semiconductor,
   (c) placing a small chip of indium over said arsenic trioxide,
   (d) applying heat directly to said indium and arsenic trioxide until said arsenic trioxide sublimes and said indium flows onto and amalgamates with said indium arsenide completing a strong mechanical and electrical bond upon cooling between said electrical lead and said semiconductor.

3. The method for attaching indium arsenide semiconductor to electrical leads comprising:
   (a) placing an indium arsenide semiconductor on a means for heating the semiconductor to a temperature below its recrystallization point, and heating the semiconductor,
   (b) placing an electrical lead in contact with the semiconductor,
   (c) placing a few grains of arsenic trioxide in proximity with the spot where said electrical lead is to be bonded to said semiconductor, (d) placing a small chip of indium over said arsenic trioxide, (e) applying heat directly to said indium and arsenic trioxide until said arsenic trioxide sublimes and said indium flows onto and amalgamates with said indium arsenide completing a strong mechanical and electrical bond upon cooling between said electrical lead and said semiconductor.

References Cited by the Examiner

UNITED STATES PATENTS 3,128,538 4/1964 Kutschera ------------ 29—504

JOHN F. CAMPBELL, *Primary Examiner.*

L. J. WESTFALL, *Assistant Examiner.*